US006706463B2

(12) United States Patent
Inno et al.

(10) Patent No.: US 6,706,463 B2
(45) Date of Patent: Mar. 16, 2004

(54) METHOD FOR MAKING LITHOGRAPHIC PRINTING PLATE

(75) Inventors: Toshifumi Inno, Shizuoka-Ken (JP); Tsumoru Hirano, Shizuoka-Ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

(21) Appl. No.: 10/145,783

(22) Filed: May 16, 2002

(65) Prior Publication Data

US 2003/0013043 A1 Jan. 16, 2003

(30) Foreign Application Priority Data

May 22, 2001 (JP) .......................................... 2001-152127

(51) Int. Cl.[7] .............................. G03F 7/11; G03F 7/30

(52) U.S. Cl. ................. 430/302; 430/272.1; 430/273.1; 430/280.1; 430/281.1; 430/348; 430/413; 430/434; 430/494; 430/944; 430/945; 101/463.1

(58) Field of Search .......................... 430/270.1, 271.1, 430/272.1, 273.1, 280.1, 281.1–288.1, 302, 303, 348, 401, 413, 434, 494, 944, 945, 964; 101/130, 453, 463.1, 465, 466, 467

(56) References Cited

U.S. PATENT DOCUMENTS 5,536,619 A * 7/1996 Verburgh ................. 430/273.1
5,968,709 A * 10/1999 Verschueren et al. .... 430/272.1
6,344,306 B1 * 2/2002 Fujiyoshi et al. ........ 430/272.1

FOREIGN PATENT DOCUMENTS

EP 573 091 A1 * 12/1993 ........... B41C/1/055

* cited by examiner

*Primary Examiner*—Janet Baxter
*Assistant Examiner*—Barbara Gilliam
(74) *Attorney, Agent, or Firm*—Burns, Doane, Swecker & Mathis, LLP

(57) ABSTRACT

A method for making a lithographic printing plate comprises the steps of imagewise exposing, to a laser beam, a PS plate comprising a substrate, a heat-sensitive layer containing at least one light-heat conversion agent and a binder polymer formed on the substrate and a hydrophilic or lipophobic layer applied onto the heat-sensitive layer; and then removing the hydrophilic or lipophobic layer on the laser-exposed area by developing the imagewise exposed printing plate within 120 seconds from the completion of the laser-exposure to thus give a lithographic printing plate, wherein the developing treatment comprises the step of rubbing the exposed printing plate surface with an abrasion means in the absence of any liquid. This method permits the production of a lithographic printing plate without causing any deterioration of the developing properties of the PS plate even when the imagewise exposed PS plate is developed within a short period of time after the completion of the laser-exposure.

8 Claims, No Drawings

METHOD FOR MAKING LITHOGRAPHIC PRINTING PLATE

BACKGROUND OF THE INVENTION

The present invention relates to a method for making a lithographic printing plate, which comprises the steps of imagewise exposing, to a laser beam, a presensitized plate useful for making a lithographic printing plate (hereinafter, referred to as a PS plate), which permits the heat mode-recording with a laser beam, and then developing the imagewise exposed plate within a short period of time after the imagewise exposure.

The lithographic printing plate in general comprises a lipophilic image area, which receives ink during the printing process, and a hydrophilic non-image area, which receives dampening water. As a plate useful for making such a lithographic printing plate, there has widely been used a PS plate, which comprises a hydrophilic substrate provided thereon with a lipophilic light-sensitive resin layer. The plate-making process for such a PS plate currently comprises exposing the PS plate to light rays through images such as an image-carrying lithfilm and then removing the non-image area through dissolution thereof with a developer to thus give a desired printing plate.

The plate-making process for the conventional PS plates requires the removal of non-image areas through dissolution after the imagewise exposure thereof to light rays. Therefore, it is one of important problems, to be solved, associated with the conventional technique to eliminate or simplify such an additional wet process. In addition, it has recently been a matter of primary concern in the entire industrial fields to dispose or deal with waste liquor exhausted through such wet treatments of imagewise exposed lithographic printing plate from the viewpoint of the environmental protection and it has increasingly and strongly been required to improve the conventional plate-making process in this respect.

As a simple plate-making process proposed in response to such a demand, there has been known a method, which makes use of such a PS plate provided thereon with an image-recording layer whose non-image areas can be removed during the usual printing process and the method comprises the steps of exposing the PS plate to light rays and developing the same on a printing machine to thus give a final printing plate. Such a plate-making process has been referred to as the on-machine developing method. More specifically, this method comprises, for instance, the use of an image-recording layer or non-image areas soluble in the dampening water or a solvent for ink, or the step of mechanically removing the non-image areas through the contact thereof with the impression cylinder or the blanket cylinder in a printing machine. In this respect, however, the imagewise exposed layer is not yet fixed even after the exposure of a PS plate and therefore, the on-machine developing method suffers from an important problem in that it is necessary to adopt a troublesome method for the protection of the imagewise exposed area till the imagewise exposed printing plate is fitted to the printing machine. For instance, the imagewise exposed plate should be stored under completely light-shielded conditions or constant temperature conditions.

On the other hand, there has been another recent tendency in this field. More specifically, there has widely been used digitizing techniques in which image information is electronically processed, accumulated and outputted using a computer and a variety of new image-outputting techniques have been practically used in response to the development of such digitizing techniques. In response to this, the computer-to-plate technique has attracted special interest recently, which comprises the steps of incorporation of digitized image information into highly coherent radiant rays such as laser beams and scanning-exposure of a PS plate to the radiant rays to thus directly prepare a printing plate without using any lithfilm. For this reason, it has recently been an important technical subject to develop a PS plate suitably used for this purpose. Under such circumstances, there has increasingly and still more strongly been desired for the development of a simplified plate-making technique, a dry plate-making method or a treatment free technique, from the viewpoint of both the environmental protection discussed above and the applicability to the digitalization.

Among solid lasers, those having a high power or output such as semiconductor lasers and YAG lasers have been commercially available at a low price and therefore, a plate-making process using these lasers as image-recording means has, in particular, been considered to be a promising technique as the method for preparing printing plates, which makes use of scanning light-exposing step capable of being easily incorporated into the digitized technique. In the conventional plate-making process, an image is recorded by imagewise exposing a light-sensitive plate to light at a low to intermediate illuminance to induce a photochemical reaction and to thus cause imagewise changes of physical properties, while in the method using high power density-exposure with a high output laser, a light-exposed area is convergently exposed to a large quantity of light energy within an instantaneous exposure time to cause a chemical change and/or a thermal change such as a phase change or a change in shape or structure through the effective conversion of the optical energy into thermal energy. In other words, the latter method makes use of the foregoing changes in order to record images on the PS plate or image information is inputted through the optical energy of, for instance, a laser beam, but the image is recorded through a reaction induced by the thermal energy originated from the optical energy. In general, a recording method, which makes use of heat generation due to such high power density light-exposure has been called "heat mode recording" and the conversion of optical energy into heat energy is referred to as "light-heat conversion".

An important advantage of the plate-making method, which makes use of such a heat mode recording means, is that the PS plate used is not sensitive to light rays having an illuminance of the usual level such as the room illumination and that the fixation of images recorded through light-exposure at a high illuminance is not essential. In other words, if a heat mode recordable light-sensitive material is used in recording images, it is safe against the room illumination prior to the light-exposure thereof and any fixation of images is not essential even after the imagewise exposure of the material. For instance, if using an image-recording layer capable of being solubilized or insolubilized through the heat mode light-exposure and conducting the plate-making process for imagewise removing the exposed image-recording layer to give a printing plate according to the on-machine developing method, a novel printing system can be realized, in which the development (removal of non-image areas) is not adversely affected or the images thus formed are not likewise adversely affected even when the light-sensitive material is exposed to, for instance, the room illumination for a certain time after the imagewise exposure thereof. Therefore, it would be expected that the use of the heat mode recording technique permits the preparation of, in particular, a PS plate desirably used in the on-machine developing method.

As a preferred example of such a method for preparing a lithographic printing plate based on such heat mode recording technique, there has been proposed one comprising the steps of forming a hydrophilic or lipophobic layer on a heat mode recording layer, subjecting the resulting layers to imagewise heat mode exposure, subjecting the recorded layer to abrasion and optionally removing the hydrophilic layer or the lipophobic layer on the exposed area by the wet process.

Examples of such PS plates include those each comprising a heat-sensitive layer containing, for instance, a laser beam-absorbing agent such as carbon black and a self-oxidizable binder such as nitrocellulose, provided thereon with a hydrophilic or lipophobic layer. The PS plate provided with a hydrophilic layer is disclosed in, for instance, WO 98/40212, WO 98/34796, WO 94/18005 and Japanese Un-Examined Patent Publication (hereunder referred to as "J.P. KOKAI") Nos. Hei 6-199064 and Hei 8-282143, while those provided with a lipophobic layer are disclosed in, for instance, Japanese Examined Patent Publication (hereunder referred to as "J.P. KOKOKU") No. Sho 42-21879, J.P. KOKAI Nos. Sho 50-158405, Hei 6-55723 and Hei 6-186750, U.S. Pat. No 5,353,705 and WO 94/01280.

When a PS plate provided with a heat-sensitive layer comprising a laser beam-absorbing agent and a binder polymer is subjected to a treatment (developing treatment) of removing the upper layer thereof or the hydrophilic or lipophobic layer is conducted by abrasion immediately after the heating through laser beam-exposure, however, a problem arises such that the ability of removing the hydrophilic or lipophobic layer on the laser-exposed area (developing ability) is substantially impaired as compared with that observed when the same treatment for the removal of the layer is carried out after the elapse of a sufficient period of time from the heating through laser beam-exposure.

For instance, if using a so-called CTC (computer-to-cylinder) type printing machine such as those disclosed in Japanese Patent Nos. 2,938398 and 2,648,081, U.S. Pat. No. 5,755,158, European Patent No. 887204A and U.K. Patent No. 2297719A, which comprise fitting a PS plate onto the cylinder of a printing machine, exposing the PS plate to laser beam emitted from a laser installed in the printing machine and then washing (developing) the surface of the exposed printing plate in a plate surface-washing machine installed in the printing machine, or supplying dampening water and/or ink to the plate surface to thus conduct on-machine development, each process is automated and the plate-making process is continuously carried out. Therefore, the developing treatment is conducted within a relatively short period of time after the laser-exposure. Accordingly, there has been desired for the development of a PS printing plate, which shows high developing ability even in such a developing treatment initiated within a relatively short period of time after the laser-exposure and can thus be applied to the CTC type printing machine.

SUMMARY OF THE INVENTION

Accordingly, it is an object of the present invention to provide a method for making a lithographic printing plate, which comprises the steps of imagewise exposing, to a laser beam, a PS plate capable of being recorded according to the heat mode-recording technique using a laser beam and then developing the imagewise exposed plate within 120 seconds after the exposure, wherein the method can ensure an excellent developing properties.

The inventors of this invention have conducted various studies to achieve the foregoing object, have found that the heat-sensitive layer comprises a light-heat conversion agent and a binder polymer and that the imagewise exposed printing plate is rubbed with an abrasion member in the absence of any liquid and have thus completed the present invention.

According to the present invention, there is thus provided a method for making a lithographic printing plate, which comprises the steps of imagewise exposing, to a laser beam, a PS plate comprising a substrate, a heat-sensitive layer containing at least one light-heat conversion agent and a binder polymer formed on the substrate and a hydrophilic or lipophobic layer applied onto the heat-sensitive layer; and then removing the hydrophilic or lipophobic layer on the laser-exposed area by developing the imagewise exposed printing plate within 120 seconds from the completion of the laser-exposure to thus give a lithographic printing plate, wherein the developing treatment comprises the step of rubbing the exposed printing plate surface with an abrasion means in the absence of any liquid. This method would ensure the achievement of a high developing ability.

The reason why the developing ability of the exposed printing plate is deteriorated if the development thereof is conducted without the elapse of a sufficient time after the laser-exposure has not yet been clearly elucidated, but it would be recognized that the heat-sensitive layer heated through the laser-exposure is not yet sufficiently cooled and the exposed heat-sensitive layer is developed while it is still in a softened state and this would be a cause of the deterioration of the developing ability of the printing plate. In the present invention, the term "developing ability of a PS printing plate" means the probability of removing the hydrophilic or lipophobic layer on the laser-exposed area. For this reason, it is effective for compensating the deterioration of the developing ability immediately after the laser beam-exposure to improve the rate of removal of the hydrophilic or lipophobic layer on the laser-exposed area.

When the hydrophilic or lipophobic layer on the laser-exposed area is removed by rubbing the plate surface with an abrasion member, the abrasion treatment in the presence of a liquid may considerably reduce the efficiency of removing the hydrophilic or lipophobic layer on the laser-exposed area since the abrasion resistance between the plate surface and the abrasion member is reduced as compared with that observed when the step is carried out in the absence of any liquid. For this reason, the method of the present invention in which the abrasion treatment is conducted in the absence of any liquid permits the improvement of the efficiency of removing the hydrophilic or lipophobic layer on the laser-exposed area and therefore, the problem concerning the deterioration of the developing ability due to the heat history of the heat-sensitive layer heated by the laser beam-exposure may be solved. with an abrasion means in the absence of any liquid.

In another embodiment, the present invention provides a method as described in the above, wherein the developing treatment comprises a step of rubbing the plate surface with an abrasion means in the presence of a liquid after the step of rubbing the plate surface in the absence of any liquid.

In a preferred embodiment, the heat-sensitive layer is an ink-receptive layer and a part of the heat-sensitive layer on the laser-exposed area may be removed together with the hydrophilic or lipophobic layer.

In another preferred embodiment, the heat-sensitive layer comprises a polymer having at least one functional group selected from the group consisting of —OH, —SH, —$NH_2$, —NH—, —CO—$NH_2$, —CO—NH—, —O—CO—NH—, —NH—CO—NH—, —CO—OH, —CO—O—, —CO—$O^-$, —CS—OH, —CO—SH, —CO—O—CO—, —$SO_3H$, —$SO_2(O^-)$, —$PO_3H_2$, —$PO(O^-)_2$, —$SO_2$—$NH_2$, —$SO_2$—NH—, —CO—$CH_2$—CO—, —CH=CH—, —CH=$CH_2$, —CO—CH=$CH_2$, —CO—C($CH_3$)=$CH_2$,

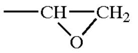 , 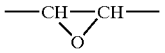 ,

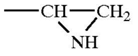 and 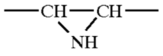 .

In another preferred embodiment, the heat-sensitive layer further comprises a crosslinking agent.

In another preferred embodiment, the light-heat conversion agent efficiently absorbs infrared light rays having a wavelength ranging from 700 nm to 1200 nm.

In another preferred embodiments, the hydrophilic layer is selected from the group consisting of (A) a layer comprising organic hydrophilic matrix, (B) a layer comprising inorganic hydrophilic matrix and (C) thin film of metals or metal compounds having hydrophilic surfaces, wherein the organic hydrophilic matrix is obtained by crosslinking or quasi- crosslinking of organic hydrophilic polymers and the inorganic hydrophilic matrix is obtained by sol-gel transformation consisting of hydrolysis or condensation reactions of polyalkoxy silane, titanates, zirconates or aluminates.

In another preferred embodiments, the lipophobic layer is a layer of silicone rubber which is selected from the group consisting of (i) condensed type silicone rubber, (ii) addition type silicone rubber and (iii) radiant ray-curable silicone rubber.

BEST MODE FOR CARRYING OUT THE INVENTION

The present invention will hereunder be described in more detail.

The basic structure of the PS plate used in the method of the present invention comprises a substrate provided thereon with, in order, a heat-sensitive layer containing at least one light-heat conversion agent and a binder polymer and a hydrophilic or lipophobic layer. Moreover, the method for making a lithographic printing plate according to the present invention comprises the steps of imagewise exposing the foregoing PS plate to a laser beam and then removing the hydrophilic or lipophobic layer on the laser-exposed area through development within 120 seconds from the imagewise exposure to the laser beam.

(Heat-Sensitive Layer)

The heat-sensitive layer used in the method of the invention comprises (1) at least one light-heat conversion agent and (2) a polymer binder. Moreover, when the upper layer on the laser-exposed area is removed through development, the whole of the heat-sensitive layer on the laser-exposed area may be removed to thus expose the ink-receptive lower layer or a part of the heat-sensitive layer on the laser-exposed area may be removed together with the upper layer and the remaining heat-sensitive layer may function as an ink-receptive layer. However, it is preferred to adopt the embodiment in which the heat-sensitive layer on the laser-exposed area remains while taking into consideration the necessity of imparting ink-receptivity to the lower layer and the reduction of the sensitivity. To this end, the heat-sensitive layer is preferably ink-receptive and hardened through the use of a crosslinking agent.

The light-heat conversion agent (1) used in the present invention may be any substance, which can absorb light rays such as ultraviolet, visible, infrared and white light rays and convert them into heat, and particularly preferred are dyes, pigments, metals or metal compounds, which can efficiently absorb infrared light rays having a wavelength ranging from 700 nm to 1200 nm.

Dyes usable herein are any known ones such as commercially available dyes and those disclosed in literatures (for instance, "SENRYO BENRAN (A Handbook of Dyes)", edited by Organic Synthetic Chemistry Association, Published in 1970 (Showa 45)). Specific examples thereof are dyes such as azo dyes, metal complex azo dyes, pyrazolone azo dyes, anthraquinone dyes, phthalocyanine dyes, carbonium dyes, quinoneimine dyes, methine dyes, cyanine dyes and metal thiolato complex. Preferred examples thereof are cyanine dyes such as those disclosed in, for instance, J.P. KOKAI Nos. Sho 58-125246, Sho 59-84356, Sho 59-202829 and Sho 60-78787; methine dyes such as those disclosed in, for instance, J.P. KOKAI Nos. Sho 58-173696, Sho 58-181690 and Sho 58-194595; naphthoquinone dyes such as those disclosed in, for instance, J.P. KOKAI Nos. Sho 58-112793, Sho 58-224793, Sho 59-48187, Sho 59-73996, Sho 60-52940 and Sho 60-63744; squarylium dyes such as those disclosed in, for instance, J.P. KOKAI No. Sho 58-112792; and cyanine dyes such as those disclosed in, for instance, U.K. Patent No. 434,875.

Preferably used dyes also include, for instance, near infrared-absorbing sensitizers disclosed in U.S. Pat. No. 5,156,938; substituted arylbenzo (thio) pyrylium salts disclosed in U.S. Pat. No. 3,881,924; trimethine thiapyrylium salts disclosed in J.P. KOKAI No. Sho 57-142645 (U.S. Pat. No. 4,327,169); pyrylium compounds such as those disclosed in J.P. KOKAI Nos. Sho 58-181051, Sho 58-220143, Sho 59-41363, Sho 59-84248, Sho 59-84249, Sho 59-46063 and Sho 59-146061; cyanine dyes such as those disclosed in J.P. KOKAI No. Sho 59-216146; pentamethine thiopyrylium salts such as those disclosed in U.S. Pat. No. 4,283,475; and pyrylium compounds such as those disclosed in J.P. KOKOKU Nos. Hei 5-13514 and Hei 5-19702. Examples of dyes likewise preferably used herein include near infrared-absorbing dyes represented by Formulas (I) and (II) as disclosed in U.S. Pat. No. 4,756,993. Among these dyes, particularly preferred are cyanine dyes, squarylium dyes, pyrylium salts and nickel thiolato complex.

Pigments usable in the present invention are those commercially available ones and those disclosed in A Handbook of Color Index (C.I.), "A Handbook of Up-To-Date Pigments" (edited by Japan Pigment Engineering Association, 1977); "Applied Technique for Latest Pigments", 1986, published by CMC Publishing Company; and "Techniques for Printing Ink", 1984, CMC Publishing Company. Kinds of pigments are, for instance, black pigments, yellow pigments, orange pigments, brown pigments, red pigments, purple pigments, blue pigments, green pigments, fluorescent pigments, metal powder pigments and polymer-bonded dyes. Specific examples thereof are insoluble azo pigments, azo lake pigments, condensed azo pigments, chelate azo pigments, phthalocyanine pigments, anthraquinone pigments, perylene and perinone pigments, thioindigo pigments, quinacridone pigments, dioxazine pigments, isoindolinone pigments, quinophthalone pigments, dyeing lake pigments, azine pigments, nitroso pigments, nitro pigments, natural pigments, fluorescent pigments, inorganic pigments and carbon black. Among these, preferred is carbon black.

These pigments may be used without subjecting to any surface treatment or may be subjected to a surface treatment. Such surface treatment herein used may be, for instance, a method comprising coating the surface of pigments with a resin or a wax; a method for adhering a surfactant to the surface thereof; or a method for linking a reactive substance (such as a silane coupling agent, an epoxy compound or a polyisocyanate) to the surface of pigments. The foregoing surface treatments are disclosed in "Properties and Applications of Metal Soap" (published by SAIWAI SHOBO Publishing Company); "Techniques for Printing Ink" (1984, CMC Publishing Company); and "Applied Technique for Latest Pigments", 1986, published by CMC Publishing Company.

The particle size of pigments preferably ranges from 0.01 to 10 μm, more preferably 0.05 to 1 μm and particularly preferably 0.1 to 1 μm. This is because if the particle size thereof is less than 0.01 μm, the substances dispersed in a coating liquid for forming a light-sensitive layer is insufficient in the stability, while if the particle size exceeds 10 μm, the resulting image-recording heat-sensitive layer is insufficient in the uniformity. These pigments may be dispersed in the coating liquid for forming a light-sensitive layer according to any known dispersing technique currently used in the production of ink and/or toner. Examples of dispersing devices are an ultrasonic dispersing device, a sand mill, an attritor, a pearl mill, a super mill, a ball mill, an impeller, a disperser, a KD mill, a colloid mill, a dynatron, a three-roll mill and a pressure kneader. The details thereof are disclosed in "Applied Technique for Latest Pigments", 1986, published by CMC Publishing Company.

These light-heat conversion agents may be used alone or in any combination of at least two of them. The amount thereof to be used ranges from 5 to 50% by weight, preferably 8 to 45% by weight and more preferably 10 to 40% by weight on the basis of the total solid content (by weight) of the heat-sensitive layer. This is because if the added amount thereof is less than 5% by weight, the sensitivity of the resulting heat-sensitive layer is reduced, while if it exceeds 50% by weight, the film of the resulting heat-sensitive layer becomes fragile and the non-image area of the layer is quite susceptible to contamination upon printing.

The binder polymer (2) used in the present invention is a polymer having a film-forming ability. Examples thereof include celluloses and cellulose derivatives such as nitrocellulose and ethyl cellulose; homopolymers and copolymers of acrylic acid esters and methacrylic acid esters such as poly(methyl methacrylate) and poly(butyl methacrylate); polystyrene; homopolymers and copolymers of styrene type monomers such as α-methyl styrene; various kinds of synthetic rubber derived from isoprene and styrene-butadiene; homopolymers of vinyl esters such as polyvinyl acetate and copolymers of vinyl acetate-vinyl chloride; various kinds of condensed polymers such as polyurea, polyurethane, polyesters and polycarbonates; and binders used in so-called "chemical sensitizers" disclosed in J. Imaging Sci. 1986, 30(2): 59–64 (Frechet et al.); Polymers in Electronics (Symposium Series, P11, 242, T. Davidson, Ed. ACS Washington, D.C. (1984) (Ito, Willson); and Microelectronic Engineering, 1991, 13: 3–10 (E. Reichmanis, L. F. Thompson).

Among them, preferred are polymers having functional groups, which can be used in the crosslinking reaction with a crosslinking agent to thus harden the heat-sensitive layer. Examples of preferred such functional groups are —OH, —SH, $—NH_2$, —NH—, $—CO—NH_2$, —CO—NH—, —O—CO—NH—, —NH—CO—NH—, —CO—OH, —CO—O—, $—CO—O^-$, —CS—OH, —CO—SH, —CO—O—CO—, $—SO_3H$, $—SO_2(O^-)$, $—PO_3H_2$, $—PO(O^-)_2$, $—SO_2—NH_2$, $—SO_2—NH—$, $—CO—CH_2—CO—$, —CH=CH—, $—CH=CH_2$, $—CO—CH=CH_2$, $—CO—C(CH_3)=CH_2$, and the following groups:

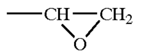 , 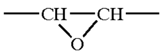 , 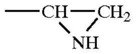 , 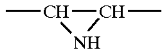 .

Among these, particularly preferred are hydroxyl group, amino groups, carboxyl group, epoxy groups and polymerizable vinyl groups.

Binder polymers preferably used in the present invention may be, for instance, condensates, for instance, homopolymers or copolymers of carboxyl group-containing monomers such as acrylic acid and methacrylic acid; homopolymers or copolymers of hydroxyl group-containing acrylic acid or methacrylic acid esters such as hydroxyethyl methacrylate and 2-hydroxypropyl acrylate; homopolymers or copolymers of epoxy group-containing acrylic acid or methacrylic acid esters such as glycidyl methacrylate; homopolymers or copolymers of N-alkyl acrylamides and acrylamides; homopolymers or copolymers of reaction products of amines with glycidyl acrylate, glycidyl methacrylate or glycidyl allyl; homopolymers or copolymers of p-hydroxystyrene and vinyl alcohols; polyurethane resins; polyurea resins; polyamide (nylon) resins; epoxy resins; polyalkylene imines; novolak resins; melamine resins; and cellulose derivatives. These polymers may be used alone or in any combination of at least two of them. The amount thereof to be used ranges from 20 to 95% by weight, preferably 25 to 80% by weight, more preferably 30 to 75% by weight and most preferably 50 to 75% by weight on the basis of the total weight of the solid contents present in the heat-sensitive layer.

The crosslinking reaction used for hardening the heat-sensitive layer in the present invention may be covalent bond-forming reactions by the action of heat or light or ionic bond-forming reactions using a polyvalent metal salts. Alternatively, it is also possible in the present invention to harden the heat-sensitive layer by the use of a known crosslinking agent. Examples of such known crosslinking agents include polyfunctional isocyanate compounds, polyfunctional epoxy compounds, polyfunctional amine compounds, polyol compounds, polyfunctional carboxyl compounds, aldehyde compounds, polyfunctional (meth) acrylic compounds, polyfunctional vinyl compounds, polyfunctional mercapto compounds, polyvalent metal salt compounds, polyalkoxy silane compounds, polyalkoxy titanium compounds, polyalkoxy aluminum compounds, metal chelate compounds (such as titanium diisopropoxide bis(2,4-pentanedionate), titanium diisopropoxide bis(ethyl acetoacetate) and aluminum tris(2,4-pentane-dionate)), polymethylol compounds, and polyalkoxy methyl compounds. In this respect, it is also possible to promote the crosslinking reaction by the addition of a known reaction catalyst. Among the foregoing crosslinking agents, preferably used herein are metal chelate compounds since they can improve the adhesion to the hydrophilic or lipophobic layer on the heat-sensitive layer. The amount thereof to be used ranges from 0 to 50% by weight, preferably 3 to 40% by weight and more preferably 5 to 35% by weight on the basis of the total weight of the solid contents present in the coating liquid for forming the heat-sensitive layer.

In the present invention, the heat-sensitive layer may further comprise other additives. These additives are incorporated into the same depending on a variety of purposes, for instance, for the improvement of the mechanical strength of the heat-sensitive layer, the improvement of the sensitivity of the layer to laser-recording and the improvement of the adhesion of the same to the substrate and/or the neighboring layers such as intermediate layers. For instance, a known compound, which can be decomposed by heating to thus generate gases, may be added in order to improve the sensitivity to laser-recording. In this case, the heat-sensitive layer undergoes an abrupt volume change to thus improve the laser-recording ability of the layer. Examples of such additives are azidodicarbonamide, sulfonyl hydrazine and dinitrosopenta- methylenetetramine.

Alternatively, it is also possible to use, as an additive, a known compound, which can be decomposed by heating to thus form an acidic compound. The use of these additive in combination with a chemical sensitizing binder would permit the substantial reduction of the decomposition temperature of the constituent substance of the heat-sensitive layer and in turn the improvement of the laser-recording ability of the heat-sensitive layer. Examples of such additives are various kinds of iodonium salts, sulfonium salts, phosphonium tosylate, oxime sulfonate, dicarbodiimide sulfonate and triazine.

Moreover, a known adhesion-improving agent (such as a silane coupling agent or titanate coupling agent) may be added to the heat-sensitive layer. In addition to the foregoing, the heat-sensitive layer may likewise comprise, if necessary, other various kinds of additives such as a surfactant for the improvement of the coating properties of the liquid for forming the layer.

The foregoing composition used in the present invention for forming the heat-sensitive layer is dissolved or dispersed in an appropriate solvent selected from the group consisting of, for instance, 2-methoxy ethanol, 2-methoxyethyl acetate, propylene glycol methylethyl acetate, methyl lactate, ethyl lactate, propylene glycol monomethyl ether, ethanol, isopropanol, methyl ethyl ketone, N,N-dimethylformamide, N,N-dimethyl acetamide, tetrahydrofuran, dioxane and mixture thereof, followed by the application thereof onto a substrate and then drying. The amount (as expressed in terms of the mass weighed after drying) of the resulting coating liquid suitably ranges from 0.1 to 10 $g/m^2$, preferably 0.3 to 5 $g/m^2$ and more preferably not less than 0.5 $g/m^2$ and less than 3 $g/m^2$. If the coated amount (weighed after drying) of the heat-sensitive layer is less than 0.1 $g/m^2$, undesirable results are obtained, for instance, the laser-recording ability of the resulting layer is impaired and the ink-receiving ability thereof is likewise reduced. In addition, there is such a tendency that the consumption of ink increases as the coated amount of the layer increases and therefore, this is not favorable from the economical standpoint.

(Substrate)

The substrate for the PS plate used in the present invention is a plate-like material having a flexibility so that it can be set on the usual printing machine and simultaneously having dimensional stability sufficient for withstanding the load applied to the substrate or printing plate during printing. Examples of such plate-like materials are paper; metal plates (such as aluminum, zinc and copper plates); plastic films (such as cellulose diacetate, cellulose triacetate, cellulose propionate, cellulose butyrate, cellulose acetate butyrate, cellulose nitrate, polyethylene terephthalate, polyethylene naphthalate, polyethylene, polystyrene, polypropylene, polycarbonate and polyvinyl acetal films); paper or metal plates laminated with the foregoing plastic films; and paper or plastic films laminated with the foregoing metals or on which the foregoing metals are deposited.

The thickness of the substrate suitably ranges from 25 μm to 3 mm and preferably 75 μm to 500 μm, but the optimum thickness thereof may vary depending on the kinds of substrates used and printing conditions. In general, the thickness of the substrate most preferably ranges from 100 to 300 μm.

In the present invention, the substrate preferably used in the PS plate is a polyester film or an aluminum plate. Among them, particularly preferred are aluminum plates because they have high dimensional stability and are relatively cheap. The aluminum plate suitably used herein is a pure aluminum plate and an alloy plate comprising aluminum, as a principal component, and trace amounts of foreign elements or it may likewise be a plastic film laminated with an aluminum foil or on which aluminum is deposited. The foreign elements included in the aluminum alloy are, for instance, silicon, iron, manganese, copper, magnesium, chromium, zinc, bismuth, nickel and titanium. The content of these foreign elements in the aluminum alloy is on the order of not more than 10% by weight. The aluminum substrate particularly suitably used in the present invention is a pure aluminum plate, but may be one containing a trace amount of foreign elements since it is difficult to obtain a completely pure aluminum plate because of the limitation in the aluminum refining technique. As has been discussed above, the aluminum plate used in the present invention must not have any specific composition and may be any one derived from any conventionally known and currently used raw material. In the present invention, the substrate may be subjected to a surface-modifying treatment such as a surface-roughening treatment by, for instance, sandblasting and/or corona discharge treatment or an intermediate layer may be positioned between the substrate and the heat-sensitive layer, for the improvement of, for instance, the adhesion between the substrate and the heat-sensitive layer and the printing characteristic properties. For instance, the surface-roughening treatment can be conducted as follows:

The aluminum plate is, if desired, subjected to a degreasing treatment with, for instance, a surfactant, an organic solvent or an alkaline aqueous solution for the removal of the rolling oil adhered to the surface thereof, prior to the surface roughening treatment of the plate. The surface-roughening treatment of the aluminum plate can be carried out according to a variety of methods such as a method comprising mechanically surface-roughening the plate, a method in which the surface is electrochemically dissolved and roughened and a method in which the surface is selectively and chemically dissolved. Examples of such mechanical methods usable herein are known ones such as ball polishing, brush polishing, blast polishing and buff polishing methods. Moreover, the electrochemical surface-roughening method is, for instance, carried out in an electrolyte containing hydrochloric acid solution or nitric acid using an alternating or direct current. In addition, the surface-roughening treatment used herein may comprise the combination of the foregoing mechanical and electrochemical methods as disclosed in J.P. KOKAI No. Sho 54-63902.

The surface-roughening treatment according to the foregoing method is preferably conducted in such a manner that the center line average surface roughness (Ra) of the aluminum surface falls within the range of from 0.2 to 1.0 μm.

The surface-roughened aluminum plate is, if necessary, subjected to an alkali etching treatment with potassium hydroxide or sodium hydroxide and subsequently subjected to an anodization treatment for the improvement of the wear resistance of the same after a neutralization treatment.

The electrolyte used in the anodization treatment of the aluminum plate may be a variety of electrolytes capable of forming a porous anodized layer and examples thereof currently used include sulfuric acid, hydrochloric acid, oxalic acid, chromic acid or a mixture thereof. The concentration of these electrolytes may appropriately be determined depending on the kind of each specific electrolyte selected.

The conditions for the anodization treatment may variously vary depending on each particular electrolyte used and cannot unconditionally be specified, but it would in general be sufficient to conduct the anodization under the following conditions: an electrolyte concentration ranging from 1 to 80% by weight; an electrolyte temperature ranging from 5 to 70° C.; a current density ranging from 5 to 60 A/$dm^2$; an electric voltage ranging from 1 to 100 V; and an electrolyzation time ranging from 10 seconds to 5 minutes.

The amount of the anodized layer to be formed preferably ranges from 1.0 to 5.0 g/$m^2$ and in particular 1.5 to 4.0 g/$m^2$. After the anodization treatment, the surface of the aluminum plate is, if necessary, hydrophilized. The hydrophilization treatment used in the present invention may be a treatment with an alkali metal silicate (such as an aqueous sodium silicate solution) such as those disclosed in U.S. Pat. Nos. 2,714,066; 3,181,461; 3,280,734; and 3,902,734. In this method, the substrate or the aluminum plate is dipped in an aqueous sodium silicate solution or electrolyzed therein.

In addition to the foregoing method, the aluminum plate may likewise be treated by, for instance, a method comprising the step of treating the aluminum plate with potassium fluorozirconate disclosed in J.P. KOKOKU No. Sho 36-22063 and polyvinyl phosphonic acid disclosed in U.S. Pat. Nos. 3,276,868; 4,153,461; and 4,689,272. Further, examples of intermediate layers used in the present invention include those obtained by applying a variety of light-sensitive polymers as disclosed in J.P. KOKAI No. Sho 60-22903 onto the substrate and then irradiating them with light rays to thus harden the same prior to the application of the heat-sensitive layer thereto; those obtained by curing epoxy resins with heating as disclosed in J.P. KOKAI No. Sho 62-50760; those obtained by curing gelatin as disclosed in J.P. KOKAI No. Sho 63-133151; those obtained using urethane resins and silane coupling agent disclosed in J.P. KOKAI No. Hei 3-200965; and those obtained using urethane resins disclosed in J.P. KOKAI No. Hei 3-273248. In addition to the foregoing, it is also effective to use those obtained by hardening gelatin or casein.

Moreover, the foregoing intermediate layer may comprise a polymer whose glass transition temperature is less than room temperature such as polyurethane, polyamide, styrene-butadiene rubber, carboxy-modified styrene/butadiene rubber, acrylonitrile/butadiene rubber, carboxy-modified acrylonitrile/butadiene rubber, polyisoprenes, acrylate rubber, polyethylene, chlorinated polyethylene and/or chlorinated polypropylene, in order to soften the intermediate layer. The polymer may be incorporated into the intermediate layer in any rate and if the polymer may form a film, the intermediate layer can be formed from the additive alone. In addition, the intermediate layer may likewise comprise other additives such as dyes, pH indicators, agents for obtaining a visible image immediately after imagewise exposure, photopolymerization initiators, auxiliary adhesives (such as polymerizable monomers, diazo resins and silane coupling agents), pigments, silica powder and/or titanium oxide powder, for the foregoing purposes. Alternatively, applying a coating liquid to the substrate and then curing the same through light-exposure may form the intermediate layer. In general, the coated amount (weighed after drying) of the intermediate layer suitably ranges from 0.1 to 10 g/$m^2$, preferably 0.3 to 8 g/$m^2$ and more preferably 0.5 to 5 g/$m^2$.

Alternatively, if a non-conductive substance such as a polyester film is used as the substrate in the present invention, it is preferred to dispose an intermediate layer, on the substrate, comprising a polymer layer in which metal oxide fine particles or a matting agent are dispersed, for the purpose of improving the adhesion between the heat-sensitive layer and the substrate and of preventing any charging.

Materials for the foregoing metal oxide fine particles used in the intermediate layer may be, for instance, $SiO_2$, ZnO, $TiO_2$, $SnO_2$, $Al_2O_3$, $In_2O_3$, MgO, BaO, $MoO_3$, $V_2O_5$ and double oxides thereof, and/or oxide comprising the foregoing metal oxide and foreign elements. These materials may be used alone or in any combination.

Preferred metal oxides are $SiO_2$, ZnO, $SnO_2$, $Al_2O_3$, $TiO_2$, $In_2O_3$ and MgO. Examples of metal oxides containing a trace amount of foreign elements are those obtained by doping ZnO with Al or In; $SnO_2$, with Sb, Nb or a halogen element; and $In_2O_3$ with Sn, in an amount of not more than 30 mole % and preferably not more than 10 mole %. The metal oxide particles are preferably included in the intermediate layer in an amount ranging from 10 to 90% by weight. The particle size of the metal oxide particles preferably ranges from 0.001 to 0.5 $\mu$m as expressed in terms of the average particle size. The term "average particle size" used herein means the value determined while taking into consideration not only the particle size of the primary particles of the metal oxide particles, but also that of metal oxide particles having higher order structures.

The matting agent used in the intermediate layer may preferably be, for instance, inorganic or organic particles having an average particle size ranging from 0.5 to 20 $\mu$m and more preferably 1.0 to 15 $\mu$m. Examples of inorganic particles are those derived from metal oxides such as silicon oxide, aluminum oxide, titanium oxide and zinc oxide; and those derived from metal salts such as calcium carbonate, barium sulfate, barium titanate and strontium titanate. On the other hand, examples of organic particles are those derived from crosslinked polymers such as poly (methyl methacrylate), polystyrene, polyolefin and crosslinked copolymers thereof. The matting agent is preferably included in the intermediate layer in an amount ranging from 1 to 30% by weight on the basis of the total weight of the latter.

The polymers usable in the intermediate layer include, for instance, proteins such as gelatin and casein; cellulose compounds such as carboxymethyl cellulose, hydroxyethyl cellulose, acetyl cellulose, diacetyl cellulose and triacetyl cellulose; sugars such as dextran, agar, sodium alginate and starch derivatives; and synthetic polymers such as polyvinyl alcohol, polyvinyl acetate, polyacrylate, polymethacrylate, polystyrene, polyacrylamide, polyvinyl pyrrolidone, polyester, polyurethane, polyvinyl chloride, polyacrylic acid and polymethacrylic acid.

The polymer is preferably included in the intermediate layer in an amount ranging from 10 to 90% by weight on the basis of the total weight of the intermediate layer.

The substrate used in the present invention preferably has a depth at the maximum roughness (Rt), on the back face thereof, of at least 1.2 $\mu$m and a kinetic coefficient of friction ($\mu$k) observed when the back face of the substrate (or the back face of the PS plate used in the present invention) slides on the surface of the PS plate on the order of not more than 2.6, in order to prevent the occurrence of any blocking. To this end, it is preferred to form a matting agent-containing layer, similar to that discussed above in connection with the intermediate layer, on the back face of the substrate or to subject the back face thereof to a surface-roughening treatment such as a sandblasting treatment.

(Hydrophilic Layer)

In the present invention, the "hydrophilic layer" means a layer, which has a hydrophilic surface and which can hold a hydrophilic liquid and has a function of repelling ink during printing operations. Examples of such hydrophilic layers preferably used herein are (A) a layer comprising organic hydrophilic matrix obtained by crosslinking or quasi-crosslinking of organic hydrophilic polymers; (B) a layer comprising inorganic hydrophilic matrix obtained by sol-gel transformation consisting of hydrolysis or condensation reactions of polyalkoxy silane, titanates, zirconates or aluminates; or (C) thin film of metals or metal compounds having hydrophilic surfaces.

(A) Layers Comprising Organic Hydrophilic Matrixes Obtained By Crosslinking or Quasi-crosslinking of Organic Hydrophilic Polymers As the crosslinking reaction used for forming organic hydrophilic matrixes, which are preferably used as the hydrophilic layers in the present invention and can be prepared by crosslinking or quasi-crosslinking of organic hydrophilic polymers, there may be listed, for instance, formation of covalent bonds by the action of heat or light rays, or formation of ionic bonds through the use of polyvalent metal salts. The organic hydrophilic polymers used in the present invention are preferably polymers carrying functional groups capable of taking part in the crosslinking reactions. Examples of preferred such functional groups are —OH, —SH, $—NH_2$, —NH—, $—CO—NH_2$, —CO—NH—, —O—CO—NH—, —NH—CO—NH—, —CO—OH, —CO—O—, $—CO—O^-$, —CS—OH, —CO—SH, —CS—SH, $—SO_3H$, $—SO_2(O^-)$, $—PO_3H_2$, $—PO(O^-)_2$, $—SO_2—NH_2$, $—SO_2—NH—$, $—CH=CH_2$, —CH=CH—, $—CO—C(CH_3)=CH_2$, $—CO—CH=CH_2$, $—CO—CH_2—CO—$, —CO—O—CO— and the following groups:

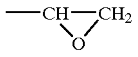 , 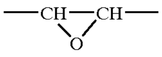 ,

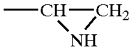 , 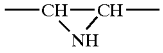 .

Among these, particularly preferred are hydroxyl group, amino groups, carboxyl group and epoxy groups.

Such an organic hydrophilic polymer usable in the present invention may be known water-soluble binders and specific examples thereof are polyvinyl alcohol (polyvinyl acetate having a degree of saponification of not less than 60%), modified polyvinyl alcohols such as carboxy-modified polyvinyl alcohol, starch and derivatives thereof, cellulose derivatives such as carboxymethyl cellulose and salts thereof and hydroxyethyl cellulose, casein, gelatin, gum Arabic, polyvinyl pyrrolidone, vinyl acetate-crotonic acid copolymer and salts thereof, styrene-maleic acid copolymer and salts thereof, polyacrylic acid and salts thereof, polymethacrylic acid and salts thereof, polyethylene glycol, polyethylene-imine, polyvinyl phosphonic acid and salts thereof, polystyrene phosphonic acid and salts thereof, poly (methacryloyloxy-propane sulfonic acid) and salts thereof, polyvinyl sulfonic acid and salts thereof, poly (methacryloyloxy-ethyl trimethyl ammonium chloride), poly(hydroxyethyl methacrylate), poly(hydroxy-ethyl acrylate), and polyacrylamide.

These polymers may be copolymers inasmuch as the hydrophilicity thereof is not impaired and may be used alone or in any combination of at least two of them. The amount thereof to be used ranges from 20 to 99% by weight, preferably 25 to 95% by weight and more preferably 30 to 90% by weight on the basis of the total weight of the solid contents present in the hydrophilic layer.

In the present invention, the crosslinking of the organic hydrophilic polymer can be conducted using any known crosslinking agent. Examples of such known crosslinking agents are polyfunctional isocyanate compounds, polyfunctional epoxy compounds, polyfunctional amine compounds, polyol compounds, polyfunctional carboxyl compounds, aldehyde compounds, polyfunctional (meth) acrylic compounds, polyfunctional vinyl compounds, polyfunctional mercapto compounds, polyvalent metal salt compounds, polyalkoxy silane compounds and hydrolyzates thereof, polyalkoxy titanium compounds and hydrolyzates thereof, polyalkoxy aluminum compounds and hydrolyzates thereof, polymethylol compounds and polyalkoxy methyl compounds. In this respect, a known reaction catalyst may be added to the reaction system to thus promote the same. The amount thereof to be used ranges from 1 to 50% by weight, preferably 3 to 40% by weight and more preferably 5 to 35% by weight on the basis of the total weight of the solid contents present in the coating liquid for forming the hydrophilic layer.

(B) Layers Comprising Inorganic Hydrophilic Matrixes Obtained By Sol-gel Transformation The system capable of undergoing the sol-gel transformation used in the formation of the inorganic hydrophilic matrix for the hydrophilic layer used in the present invention is a polymer system in which polyvalent elements are bonded together through oxygen atoms to form a network structure and the polyvalent metal simultaneously has free hydroxyl groups and/or alkoxy groups to thus form a resinous structure in which the foregoing constituents are mixed. Thus, the system is in a sol state at the stage rich in alkoxy and hydroxyl groups, while the network-like resinous structure is strengthened as the reaction for forming ether bonds proceeds. In addition, a part of the hydroxyl groups are linked to solid fine particles to modify the surface of the particles and to thus change the degree of the hydrophilicity. Such polyvalent bonding elements having hydroxyl and alkoxy groups undergoing the sol-gel transformation are aluminum, silicon, titanium and zirconium and either of them can be used in the present invention. The sol-gel transformation system, which makes used of siloxane bonds and can more preferably be used in the invention, will hereunder be described in detail. The sol-gel transformation using aluminum, titanium and zirconium can be carried out according to the following procedures described in connection with silicon, while these elements are substituted for the silicon.

Particularly preferably used herein are systems containing silane compounds capable of undergoing such sol-gel transformation and each having at least one silanol group. The system, which makes use of the sol-gel transformation will be described in more detail below. The inorganic hydrophilic matrix formed through such sol-gel transformation is preferably a resin having siloxane bonds and silanol groups and the matrix is formed by applying a coating liquid or a sol system containing a silane compound having at least one silanol group and then drying the coated layer. Thus, the hydrolysis, decomposition and condensation of silanol groups proceed as the elapse of time to thus form a structure having a siloxane skeleton and the gelation thereof proceeds to thus give an inorganic hydrophilic matrix.

In this respect, additives such as the foregoing organic hydrophilic polymer and/or crosslinking agent may be added to the matrix having a gel structure in order to improve physical properties of the resulting matrix such as film strength and flexibility, to improve the coating properties of the coating liquid and to control the degree of the hydrophilicity of the matrix. The siloxane resin forming the desired gel structure is represented by the following general formula (I) and the silane compound having at least one silanol group can be prepared by hydrolyzing a silane compound represented by the following general formula (II). More specifically, the silane compound does not necessarily comprise only a partial hydrolyzate of a silane compound of Formula (II) and may in general be an oligomer obtained by partial water-initiated polymerization of a silane compound or a mixture of a silane compound with oligomers thereof.

General Formula (I):

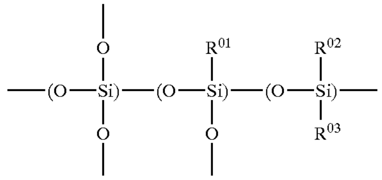

The siloxane resin represented by the foregoing general formula (I) is formed by the sol-gel transformation of at least one member selected from the group consisting of silane compounds of Formula (II). In this respect, at least one substituent in Formula (I): $R^{01}$ to $R^{03}$ is a hydroxyl group and other substituents represent organic groups selected from $R^0$ and Y in Formula (II).

General Formula (II): $(R^0)_nSi(Y)_{4-n}$

In the general formula (II), $R^0$ represents a hydroxyl group, a hydrocarbon group or a heterocyclic group; Y represents a hydrogen atom, a halogen atom (such as fluorine, chlorine, bromine or iodine atom), —$OR^1$, —$OCOR^2$ or —$N(R^3)(R^4)$ wherein $R^1$ and $R^2$ each independently represents a hydrocarbon group and $R^3$ and $R^4$ may be the same or different and each represents a hydrocarbon group; and n represents 1, 2 or 3.

Examples of the hydrocarbon groups or heterocyclic groups represented by $R^0$ in Formula (II) are as follows:

(1) Substituted or unsubstituted, linear or branched alkyl group having 1 to 12 carbon atoms (such as methyl, ethyl, propyl, butyl, pentyl, hexyl, heptyl, octyl, nonyl, decyl and dodecyl groups), wherein examples of substituents for these groups are halogen atoms (such as chlorine, fluorine and bromine atoms), hydroxyl group, thiol group, carboxyl group, sulfo group, cyano group, epoxy group, —OR' group (R' represents a methyl, ethyl, propyl, butyl, heptyl, hexyl, octyl, decyl, propenyl, butenyl, hexenyl, octenyl, 2-hydroxyethyl, 3-chloropropyl, 2-cyanoethyl, N,N-dimethyl aminoethyl, 1-bromoethyl, 2-(2-methoxyethyl)oxyethyl, 2-methoxycarbonylethyl, 3-carboxypropyl or benzyl group), —OCOR" group (R" has the same meaning as that of R'), —COOR" group, —COR" group, —$N(R''')_2$ group (R''' represents a hydrogen atom or R' and two R''' groups may be the same or different), —NHCONHR" group, —NHCOOR" group, —$Si(R'')_3$ group, —CONHR''' group and —NHCOR" and the alkyl group may have a plurality of these substituents);

(2) Substituted or unsubstituted, linear or branched alkenyl group having 2 to 12 carbon atoms (such as vinyl, propenyl, butenyl, pentenyl, hexenyl, octenyl, decenyl, dodecenyl), in which examples of substituents are identical to those listed above in connection with the foregoing alkyl group;

(3) Substituted or unsubstituted aralkyl group having 7 to 14 carbon atoms (such as benzyl, phenethyl, 3-phenylpropyl, naphthylmethyl and 2-naphthylethyl) in which examples of substituents are identical to those listed above in connection with the foregoing alkyl group;

(4) Substituted or unsubstituted alicyclic group having 5 to 10 carbon groups (such as cyclopentyl, cyclohexyl, 2-cyclohexyl ethyl, 2-cyclopentyl ethyl, norbornyl and adamantyl groups) in which examples of substituents are identical to those listed above in connection with the foregoing alkyl group and each group may have a plurality of these substituents;

(5) Substituted or unsubstituted aryl group having 6 to 12 carbon atoms (such as phenyl and naphthyl groups) in which examples of substituents are identical to those listed above in connection with the foregoing alkyl group and each group may have a plurality of these substituents; or (6) Heterocyclic group having at least one atom selected from the group consisting of nitrogen, oxygen and sulfur atoms and which may have a condensed ring (examples of the heterorings are pyran, furan, thiophene, morpholine, pyrrole, thiazole, oxazole, pyridine, piperidine, pyrrolidone, benzothiazole, benzoxazole, quinoline and tetrahydrofuran rings), which may have a substituent and in which examples of substituents are identical to those listed above in connection with the foregoing alkyl group and each group may have a plurality of these substituents.

Examples of substituents for the groups, —$OR^1$, —$OCOR^2$ or —$N(R^3)(R^4)$, represented by Y in the general formula (II) include those listed below: The substituent $R^1$ in the group —$OR^1$ may be a substituted or unsubstituted aliphatic group having 1 to 10 carbon atoms (such as methyl, ethyl, propyl, butyl, heptyl, hexyl, pentyl, octyl, nonyl, decyl, propenyl, butenyl, heptenyl, hexenyl, octenyl, decenyl, 2-hydroxyethyl, 2-hydroxypropyl, 2-methoxyethyl, 2-(methoxyethyl-oxo) ethyl, 1-(N,N-diethylamino) ethyl, 2-methoxypropyl, 2-cyanoethyl, 3-methyloxapropyl, 2-chloroethyl, cyclohexyl, cyclopentyl, cyclooctyl, chlorocyclohexyl, methoxycyclohexyl, benzyl, phenethyl, dimethoxy-benzyl, methylbenzyl and bromobenzyl groups).

In the group: —$OCOR^2$, $R^2$ represents an aliphatic group identical to that listed above in connection with $R^1$ or a substituted or unsubstituted aromatic group having 6 to 12 carbon atoms (wherein examples of such aromatic groups are identical to those listed above in connection with the aryl group in the foregoing $R^0$).

In the group: —$N(R^3)(R^4)$, $R^3$ and $R^4$ may be the same or different and each represents a hydrogen atom or a substituted or unsubstituted aliphatic group having 1 to 10 carbon atoms (such as those listed above in connection with $R^1$ as a substituent of the group —$OR^1$). More preferably, the total number of carbon atoms included in $R^3$ and $R^4$ is not more than 16.

Specific examples of the silane compounds represented by the general formula (II) are those listed below, but the present invention is not restricted to these specific ones:

Tetrachloro-silane, tetrabromo-silane, tetramethoxy silane, tetraethoxy silane, tetraisopropoxy silane, tetra-n-propyl silane, tetra-t-butoxy silane, tetra-n-butoxy silane, dimethoxy diethoxy silane, methyl trichloro-silane, methyl tribromo-silane, methyl trimethoxy silane, methyl triethoxy silane, methyl triisopropoxy silane, methyl tri-t-butoxy silane, ethyl trichloro-silane, ethyl tribromo-silane, ethyl trimethoxy silane, ethyl triethoxy silane, ethyl triisopropoxy silane, ethyl tri-t-butoxy silane, n-propyl trichloro-silane, n-propyl tribromo-silane, n-propyl trimethoxy silane, n-propyl triethoxy silane, n-propyl triisopropoxy silane, n-propyl tri-t-butoxy silane, n-hexyl trichloro-silane, n-hexyl tribromo-silane, n-hexyl trimethoxy silane, n-hexyl triethoxy silane, n-hexyl triisopropoxy silane, n-hexyl tri-t-butoxy silane, n-decyl trichloro-silane, n-decyl tribromo-silane, n-decyl trimethoxy silane, n-decyl triethoxy silane, n-decyl triisopropoxy silane, n-decyl tri-t-butoxy silane, n-octadecyl trichloro-silane, n-octadecyl tribromo-silane, n-octadecyl trimethoxy silane, n-octadecyl triethoxy silane, n-octadecyl triisopropoxy silane, n-octadecyl tri-t-butoxy silane, phenyl trichloro-silane, phenyl tribromo-silane, phenyl trimethoxy silane, phenyl triethoxy silane, phenyl triisopropoxy silane, phenyl tri-t-butoxy silane, dimethyl dichloro-silane, dimethyl dibromo-silane, dimethyl dimethoxy silane, dimethyl diethoxy silane, diphenyl dichloro-silane, diphenyl dibromo-silane, diphenyl dimethoxy silane, diphenyl diethoxy silane, phenyl methyl dichloro-silane, phenyl methyl dibromo-silane, phenyl methyl dimethoxy silane, phenyl methyl diethoxy silane, triethoxy hydrosilane, tribromo-hydrosilane, trimethoxy hydrosilane, isopropoxy hydrosilane, tri-t-butoxy hydrosilane, vinyl trichloro-silane, vinyl tribromo-silane, vinyl trimethoxy silane, vinyl triethoxy silane, vinyl triisopropoxy silane, vinyl tri-t-butoxy silane, trifluoropropyl trichloro-silane, trifluoropropyl tribromo-silane, trifluoropropyl trimethoxy silane, trifluoropropyl triethoxy silane, trifluoropropyl triisopropoxy silane, trifluoropropyl tri-t-butoxy silane, γ-glycidoxypropyl methyl dimethoxy silane, γ-glycidoxypropyl methyl diethoxy silane, γ-glycidoxypropyl trimethoxy silane, γ-glycidoxypropyl triethoxy silane, γ-glycidoxypropyl triisopropoxy silane, γ-glycidoxypropyl tri-t-butoxy silane, γ-methacryloxypropyl methyl dimethoxy silane, γ-methacryloxypropyl methyl diethoxy silane, γ-methacryloxypropyl trimethoxy silane, γ-methacryloxypropyl triisopropoxy silane, γ-methacryloxypropyl tri-t-butoxy silane, γ-aminopropyl methyl dimethoxy silane, γ-aminopropyl methyl diethoxy silane, γ-aminopropyl trimethoxy silane, γ-aminopropyl triethoxy silane, γ-aminopropyl triisopropoxy silane, γ-aminopropyl tri-t-butoxy silane, γ-mercapto-propyl methyl dimethoxy silane, γ-mercapto-propyl methyl diethoxy silane, γ-mercapto-propyl trimethoxy silane, γ-mercapto-propyl triethoxy silane, γ-mercapto-propyl triisopropoxy silane, γ-mercapto-propyl tri-t-butoxy silane, β-(3,4-epoxycyclohexyl) ethyl trimethoxy silane and β-(3,4-epoxycyclohexyl) ethyl triethoxy silane.

In the preparation of the inorganic hydrophilic matrix for the hydrophilic layer used in the present invention, a metal compound of, for instance, Ti, Zn, Sn, Zr and/or Al capable of forming a film by linking with a resin during the sol-gel transformation can be used simultaneous with the silane compound represented by the general formula (II). Examples of such metal compounds usable herein are $Ti(OR^5)_4$ ($R^5$ represents, for instance, a methyl, ethyl, propyl, butyl, pentyl or hexyl group), $TiCl_4$, $Ti(CH_3COCH—COCH_3)_2(OR^5)_2$, $Zn(OR^5)_2$, $Zn(CH_3COCHCOCH_3)_2$, $Sn(OR^5)_4$, $Sn(CH_3COCHCOCH_3)_4$, $Sn(OCOR^5)_4$, $SnCl_4$, $Zr(OR^5)_4$, $Zr(CH_3COCHCOCH_3)_4$, $Al(OR^5)_3$ and $Al(CH_3COCHCO—CH_3)_3$.

Moreover, it is preferred to simultaneously use an acidic or basic catalyst in order to promote the hydrolysis and polycondensation reaction of the silane compound of Formula (II) and further the foregoing metal compound simultaneously used. The catalyst may be used an acidic or basic compound without any pretreatment or in the form of a solution obtained by dissolving the same in a solvent such as water or an alcohol (hereunder referred to as "acidic catalyst" and "basic catalyst", respectively). The concentration of the catalyst is not restricted to any specific level, but if the concentration thereof is high, there is such a tendency that the hydrolysis and/or the polycondensation are accelerated. In this respect, however, if the basic catalyst is used in a high concentration, precipitates are sometimes formed in the sol solution and therefore, the concentration of the basic catalyst is desirably not more than 1 N (as expressed in terms of the concentration of an aqueous solution).

The kinds of acidic or basic catalysts are not particularly restricted, but specific examples thereof are hydrogen halides such as hydrogen chloride, nitric acid, sulfuric acid, sulfurous acid, hydrogen sulfide, perchloric acid, hydrogen peroxide, carbonic acid, carboxylic acids such as formic acid and acetic acid, substituted carboxylic acids obtained by substituting R of carboxylic acids (RCOOH) with other elements or substituents, sulfonic acid such as benzenesulfonic acid for the acidic catalysts; and ammoniacal bases such as aqueous ammonia and amines such as ethylamine and aniline for the basic catalysts.

The further details of the foregoing sol-gel technique are described in, for instance, SAKUHANA Sumio, "Science of Sol-Gel Techniques", published by AGUNE SHOFUSHA (1988) and HIRAJIMA Ken, "Functional Thin Film-Forming Techniques by Up-To-Date Sol-Gel Techniques", published by SOGO GIJUTU Center (1992).

The hydrophilic layer of the foregoing organic or inorganic hydrophilic matrix used in the present invention may further comprise, for instance, compounds for a variety of purposes, for instance, for controlling the degree of the hydrophilicity, for the improvement of the physical strength of the hydrophilic layer, for the improvement of the mutual dispersion properties of compositions constituting the layer, for the improvement of the printing properties and for the improvement of the coating properties of the coating liquid, in addition to the foregoing various components. Specific examples thereof are plasticizers, pigments, dyes, surfactants and hydrophilic particles.

Such hydrophilic particles are not limited to any specific one, but preferably used herein are, for instance, silica, alumina, titanium oxide, magnesium oxide, magnesium carbonate and potassium alginate particles. The use of these particles may serve to improve the hydrophilicity and to strengthen the resulting film. More preferably used herein include silica, alumina, titanium oxide and mixture thereof. According to a preferred embodiment of the present invention, the hydrophilic layer of the foregoing organic or inorganic hydrophilic matrix comprises metal oxide particles such as silica, alumina and/or titanium oxide particles.

Silica has a large number of hydroxyl groups on the surface thereof and it comprises siloxane bonds (—Si—O—Si—) in the interior thereof. Sources of silica preferably used in the present invention are silica ultrafine particles dispersed in water or a polar solvent and having a particle size ranging from 1 to 100 nm, which are also called colloidal silica. This is more specifically described in "Applied Techniques for High Purity Silica", Vol. 3, edited by KAGAMI Toshiro & HAYASHI Ei, CMC Publishing Company (1991).

In addition, the alumina preferably used herein is alumina hydrate (boehmite type one) having a colloidal particle size on the order of 5 to 200 nm and dispersed in water while using anions present in water (for instance, halogen ions such as fluoride ions and chloride ions, and carboxylic anions such as acetate ions). Moreover, preferably used titanium oxide is in the form of a dispersion of anatase or rutile type titanium oxide having an average primary particle size ranging from 50 to 500 nm in water or a polar solvent optionally using a dispersant.

The average primary particle size of the hydrophilic particles preferably used in the present invention ranges from 1 to 5000 nm and more preferably 10 to 1000 nm. In the hydrophilic layer used in the present invention, these hydrophilic particles may be used alone or in any combination of at least two thereof. The amount thereof to be used ranges from 5 to 90% by weight, preferably 10 to 70% by weight and more preferably 20 to 60% by weight on the basis of the total weight of the solid contents present in the hydrophilic layer.

The hydrophilic layer of the foregoing organic or inorganic hydrophilic matrix used in the present invention may be formed by dissolving or dispersing the foregoing components in water or a polar solvent such as methanol or ethanol, which may be used alone or in combination, applying the resulting coating liquid onto the surface of a substrate and then drying and hardening the coated layer. The amount of the coating liquid to be applied suitably ranges from 0.1 to 5 g/m$^2$, preferably 0.3 to 3 g/m$^2$ and more preferably 0.5 to 2 g/m$^2$ as expressed in terms of the mass weighed after drying. This is because if the coated amount (by weight, weighed after drying) thereof is less than 0.1 g/m$^2$, undesirable results are obtained, for instance, the ability of holding a hydrophilic liquid such as dampening water is reduced and the strength of the resulting film is likewise reduced. On the other hand, if it is too high, undesirable results are likewise obtained, for instance, the resulting film is brittle and the printing durability is reduced.

(C) Thin Films of Metals or Metal Compounds Having Hydrophilic Surfaces

The thin films of metals or metal compounds each having a hydrophilic surface and used in the hydrophilic layer employed in the present invention are not restricted to specific ones inasmuch as they have hydrophilic surfaces and specific examples thereof are thin films of metals such as aluminum, chromium, manganese, tin, tellurium, titanium,. iron,. cobalt, nickel, indium, bismuth, zirconium, zinc, lead, vanadium, silicon, copper and silver and alloys thereof as well as thin films of metal oxides, metal carbides, metal nitrides, metal borides, metal sulfides and metal halides of the corresponding metals. Indeed, the surfaces of the thin films of the foregoing metals and metal compounds are in highly oxidized states and this is quite favorable to the hydrophilicity thereof. For this reason, the thin films of metal oxides such as indium tin oxide, tungsten oxide, manganese oxide, silicon oxide, titanium oxide, aluminum oxide and zirconium oxide can quite suitably be used as the hydrophilic layers in the present invention.

Moreover, the thin films of metals or metal compounds each having a hydrophilic surface and used in the hydrophilic layer employed in the present invention can appropriately be formed by, for instance, the PVD (physical vapor deposition) technique such as the vacuum vapor deposition, sputtering or ion-plating technique; or the CVD (chemical vapor deposition) technique. For instance, the vacuum vapor deposition techniques make use of, for instance, resistance heating, high-frequency induction heating and electron beam heating, as the heating means. In addition, the reactive vapor deposition technique may likewise be used, in which a reactive gas such as oxygen or nitrogen is introduced into a deposition chamber, ozone gas is added or a means such as ion assist is used.

In case where the sputtering technique is used, a pure metal or a compound of a desired metal can be used as a target material and if a pure metal is used, a gas such as oxygen or nitrogen is introduced into the sputtering chamber as a reactive gas. The power source for the sputtering usable herein is direct current, pulsed direct current or high-frequency power supply.

The substrate may be subjected to degassing through heating or the surface of the heat-sensitive layer may be subjected to a vacuum glow discharge treatment for the improvement of the adhesion to the heat-sensitive layer or substrate, prior to the formation of the thin film according to the foregoing technique. In addition, the hydrophilic layer used in the present invention may be formed by putting a plurality of hydrophilic layers having the same or different compositions on top of each other. Moreover, in the present invention, a hydrophilic surface-protecting layer may be applied onto the hydrophilic layer for ensuring or maintaining the hydrophilicity of the surface of the hydrophilic layer. Such a protecting layer is preferably one easily removed by the action of water or dampening water and can be formed by, for instance, applying, onto the surface of the hydrophilic layer, a solution of a water-soluble polymer such as polyvinyl alcohol (polyvinyl acetate having a degree of saponification of not less than 60%), modified polyvinyl alcohols such as carboxy-modified polyvinyl alcohol, starch or derivatives thereof, cellulose derivatives such as carboxymethyl cellulose or salts thereof or hydroxyethyl cellulose, casein, gelatin, gum Arabic, polyvinyl pyrrolidone, vinyl acetate-crotonic acid copolymer, styrene-maleic acid copolymer, polyacrylic acid or salts thereof, polymethacrylic acid or salts thereof, polyethylene glycol or polyethylene-imine and then drying the coated layer. In this case, the dry weight of the hydrophilicity- protecting layer preferably ranges from 0.01 to 5 g/m$^2$ and more preferably 0.05 to 2 g/m$^2$.

(Lipophobic Layer)

The lipophobic layer used in the present invention is a layer having an ink-repellent surface. Any conventionally known one having an ink-repellent surface may be used in the invention. As such conventionally known substances each having an ink-repellent surface, there have been well known fluorine-containing compounds or silicone compounds, which have a low surface energy. In particular, silicone rubber (silicone elastomer) is suitably used herein as such a layer having an ink-repellent surface for waterless lithographic printing plates.

The silicone rubber can roughly be divided into the following three groups: (i) condensed type silicone rubber, (ii) addition type silicone rubber and (iii) radiant ray-curable silicone rubber and all of these conventionally known three types of silicone rubber materials may be used in the present invention as materials for forming the second silicone rubber layers for the waterless lithographic printing plates.

The condensed type silicone rubber layer is a film formed by curing the following composition A.

| Composition A: | | |
|---|---|---|
| (a) | Diorgano-polysiloxane | 100 parts by weight |
| (b) | Condensation Type Crosslinking Agent | 3 to 70 parts by weight |
| (c) | Catalyst | 0.01 to 40 parts by weight |

The foregoing component (a) or diorgano-polysiloxane is a polymer having repeating units represented by the following general formula (III) in which $R^{11}$ and $R^{12}$ each represents an alkyl group having 1 to 10 carbon atoms, a vinyl group or an aryl group, which may have other appropriate substituents. In general, it is preferred to use such diorgano-polysiloxane of Formula (III) in which not less than 60% of $R^{11}$ and $R^{12}$ are, for instance, methyl groups, halogenated vinyl groups and/or halogenated phenyl groups.

General Formula (III): —Si($R^{11}$)($R^{12}$)—O—

In this respect, it is preferred to use a diorgano-polysiloxane having hydroxyl groups on the both ends thereof.

Moreover, the number average molecular weight of the foregoing component (a) preferably ranges from 3,000 to 100,000 and more preferably 10,000 to 70,000.

The component (b) may be any condensed type one and preferably used herein are those represented by the following general formula (IV):

General Formula (IV): $R^{11}{}_a$.Si.$X_b$ (a+b=4, wherein a is not less than 2)

In this Formula (IV), $R^{11}$ is identical to that specified above and X represents a substituent listed below: a halogen atom such as Cl, Br or I; H; or an organic group such as OH, $OCOR^{13}$, $OR^{13}$, —O—N=C($R^{14}$)($R^{15}$) or —N($R^{14}$)($R^{15}$). In these groups, $R^{13}$ represents an alkyl group having 1 to 10 carbon atoms or an aryl group having 6 to 20 carbon atoms and $R^{14}$ and $R^{15}$ each represents an alkyl group having 1 to 10 carbon atoms.

Examples of the component (c) are known catalyst, for instance, metal carboxylates of tin, zinc, calcium and manganese such as dibutyl tin laurate, lead octylate and lead naphthenate; or chloroplatinic acid.

In addition, the addition type silicone rubber layer is a film formed by curing the following composition B.

| Composition B: | | |
|---|---|---|
| (d) | Diorgano-polysiloxane having functional groups capable of undergoing addition reaction | 100 parts by weight |
| (e) | Organo-hydrogen polysiloxane | 0.1 to 25 parts by weight |
| (f) | Addition reaction catalyst | 0.00001 to 1 part by weight |

The foregoing component "diorgano-polysiloxane having addition reactive functional groups" means an organo-polysiloxane having at least two alkenyl groups, more preferably vinyl groups, directly bonded to the silicon atom in a molecule, the alkenyl groups may be present either at the ends or in the middle of the molecule and organic groups other than the alkenyl group are, for instance, substituted or unsubstituted alkyl groups each having 1 to 10 carbon atoms or aryl groups. In addition, the component (d) may comprise a trace amount of hydroxyl groups.

The component (d) preferably has a number average molecular weight ranging from 3000 to 100000 and more preferably 10000 to 70000.

Examples of the component (e) include polydimethyl siloxane having hydrogen atoms on both ends thereof, $\alpha$, $\omega$-dimethyl polysiloxane, (methyl siloxane)/(dimethyl siloxane) copolymer having methyl groups on both ends thereof, cyclic polymethyl siloxane, polymethyl siloxane having trimethylsilyl groups on both ends thereof and (dimethyl siloxane having trimethylsilyl groups on both ends thereof)/(methyl siloxane) copolymer.

The component (f) may arbitrarily be selected from known ones, but particularly preferred are platinum-containing compounds such as elemental platinum, platinum chloride, platinic acid chloride and olefin-coordinated platinum. These silicone rubber compositions may further comprise a crosslinking-inhibitory agent such as a vinyl group-containing organo-polysiloxane such as tetracyclo (methylvinyl) siloxane, a carbon-carbon triple bond-containing alcohol, acetone, methyl ethyl ketone, methanol, ethanol or propylene glycol monomethyl ether.

Moreover, the radiant ray-curable silicone rubber layer is a film formed by irradiating, with radiant rays, a silicone-based polymer having functional groups, which are polymerizable through irradiation with radiant rays, to induce crosslinking of the polymer and to thus harden the same. Therefore, the layer can be formed by preparing a coating liquid by dissolving the base polymer together with an initiator, applying the resulting liquid onto a desired subject and then irradiating the whole surface with radiant rays. In general, a base polymer having acrylic functional groups is used and it is crosslinked by irradiating the same with ultraviolet rays.

These silicone rubber layers or materials are disclosed in detail in, for instance, "R & D Report No. 22: Up-To-Date Applied Techniques for Silicone", 1982, CMC Publishing Company, J.P. KOKOKU Nos. Sho 56-23150 and Hei 5-1934 and J.P. KOKAI No. Hei 3-15553.

Incidentally, the foregoing lipophobic layer may if necessary comprise fine powder of inorganic substances such as silica, calcium carbonate and titanium oxide; auxiliary adhesives such as silane coupling agents, titanate coupling agents and aluminum coupling agents; and/or photopolymerization initiators.

The foregoing silicone rubber layer used in the present invention can be formed by, for instance, dissolving the foregoing composition for the silicone rubber layer in a solvent selected from the group consisting of petroleum solvents, Isopar E, Isopar G and Isopar H (available from ESSO Chemical Co., Ltd.), hexane, heptane, toluene and xylene and mixture thereof, applying the resulting solution onto a substrate and then drying the same to thus harden the coated layer. The silicone rubber layer used in the present invention suffers from a problem in that if the coated amount of the layer (weighed after being dried) is too small, the ink-repellent properties of the layer is reduced and the layer is highly susceptible to defects, while if the coated amount is too high, the developing ability of the layer is reduced. Accordingly, the coated amount of the layer (weighed after being dried) preferably ranges from 0.5 to 5 $g/m^2$ and more preferably 1 to 3 $g/m^2$. Moreover, a variety of silicone rubber layers may be applied onto the foregoing silicone rubber layer.

Moreover, it is also possible to laminate a transparent film of, for instance, polyethylene, polypropylene, polyvinyl chloride polyvinylidene chloride, polyvinyl alcohol, polyethylene terephthalate or cellophane with the silicone rubber layer, or to form a coating layer of a polymer on the silicone rubber layer for protecting the surface of the silicone rubber layer. These films may be used after the orientation thereof. In addition, the surface thereof may be subjected to matting, but the protective film free of any matting treatment is preferably used in the present invention.

(Laser Exposure)

In the present invention, the heat-sensitive layer of the PS plate used in the invention absorbs optical energy emitted from a laser used for recording and converts the optical energy into heat energy, a part or the whole of the heat-sensitive layer correspondingly undergoes a chemical reaction or a physical change such as combustion, melting, decomposition, evaporation or explosion and as a result, the adhesion between the heat-sensitive layer and the upper layer thereof is reduced. The present invention uses a laser beam for the exposure of the PS plate. The laser used herein is not restricted to any specific one, but it should ensure an exposure value required for causing the reduction in the adhesion sufficient for the removal of the hydrophilic or lipophobic layer as the upper layer of the heat-sensitive layer and specific examples thereof include a gas laser such as an Ar laser and a carbonic acid gas laser, a solid laser such as a YAG laser and a semiconductor laser. In general, it is required for the use of a laser having an output of not less than 50 mW. Preferably used herein are, for instance, a semiconductor laser and a semiconductor-excited solid laser (such as a YAG laser) from the practical viewpoint such as maintenance and price. The recording wavelengths of these lasers fall within the infrared region and an oscillation wavelength ranging from 700 to 1200 nm has been used in most cases. In case where a film is formed for the protection of the surface of the hydrophilic or lipophobic layer, the lithographic printing plate may be exposed to a laser beam if the protective film is transparent to the laser beam or the plate may be exposed to the beam after the removal of the film.

(Developing Treatment)

In the present invention, the PS plate exposed to light according to the foregoing method is subjected to a developing treatment for the removal of the hydrophilic or lipophobic layer on the laser-exposed area whose adhesion to the lower layer is reduced. In the present invention, it is essential to carry out the developing treatment within 120 seconds after the imagewise exposure to the laser beam. The development treatment in the present invention comprises the step of rubbing the plate surface with an abrasion member in the absence of any liquid. For instance, the exposed PS plate is developed by rubbing, in the absence of any liquid, the plate surface with an abrasion member such as cloth, a rubber blade, a pad or a brush, while applying a pressure to the laser-exposed PS plate. Thus, the hydrophilic or lipophobic layer on the imagewise laser-exposed area is removed and the resulting exposed area serves as an ink-receiving portion. In addition, if the scum originated from the hydrophilic or lipophobic layer removed from the imagewise laser-exposed area remains on the plate surface, it is preferred to carry out a rubbing treatment in the presence of a liquid after the rubbing treatment carried out in the absence of any liquid in order to improve the cleanability or the rate of removal of such scum from the plate surface. In the present invention, the liquid used in the rubbing treatment in the presence of a liquid may be any one known as a treating liquid for lithographic printing plates.

Examples of such known treating liquids are aliphatic hydrocarbons (such as hexane, heptane, "Isopar E, H, G" (available from ESSO Chemical Co., Ltd.), gasoline and kerosine), aromatic hydrocarbons (such as toluene and xylene), halogenated hydrocarbons (such as trichlene), those obtained by adding the following polar solvents to the foregoing hydrocarbon solvents and polar solvent per se. Specific examples of such polar solvents are as follows:

- Alcohols (such as methanol, ethanol, propanol, isopropanol, benzyl alcohol, ethylene glycol monomethyl ether, 2-ethoxy ethanol, diethylene glycol monoethyl ether, diethylene glycol monohexyl ether, triethylene glycol monomethyl ether, propylene glycol monoethyl ether, dipropylene glycol monomethyl ether, polyethylene glycol monomethyl ether, polypropylene glycol and tetraethylene glycol);
- Ketones (such as acetone and methyl ethyl ketone);
- Esters (such as ethyl acetate, methyl lactate, butyl lactate, propylene glycol monomethyl ether acetate, diethylene glycol acetate and diethyl phthalate); and
- Other Polar Solvents (such as triethyl phosphate and tricresyl phosphate).

The foregoing liquid may further include, for instance, the foregoing organic solvent-containing developer to which water is added; those obtained by solubilizing the foregoing organic solvent into water using, for instance, a surfactant; those obtained by further adding an alkaline agent (such as sodium carbonate, diethanolamine and sodium hydroxide) to the foregoing liquids; simple water (tap water, pure water and distilled water); and aqueous solutions of surfactants. Among them, preferably used in the invention are water and aqueous solutions mainly comprising water from the viewpoint of safety and flammability and the concentration of such a solute is desirably less than 40% by weight. Particularly preferably used herein are aqueous solutions of surfactants (such as anionic, nonionic or cationic surfactants). The temperature of the processing liquid may be arbitrarily be selected, but it preferably ranges from 10 to 50° C.

The laser beam-exposure and developing treatment through abrasion discussed above can be conducted in a printing press (CTC type printing machine) equipped with a laser unit for imaging and a plate surface-cleaning unit, such as those disclosed in, for instance, Japanese Patent Nos. 2,938,398 and 2,648,081, U.S. Pat. No. 5,755,158, EP 887,204A and GB 2,297,719A, after a PS plate is fitted on the cylinder of the printing machine.

In addition, the developing treatment through abrasion and washing with water and drying subsequent to the development may likewise be carried out using an automated processing machine such as that disclosed in J.P. KOKAI No. Hei 2-220061.

Furthermore, if a plurality of the printing plates developed according to the foregoing method are stored while they are put on top of one another, it is preferred to insert slit sheets between neighboring two printing plates to protect the same.

The present invention will hereunder be described in more detail with reference to the following Examples, but the present invention is not restricted to the following specific Examples at all.

EXAMPLE 1

[Preparation of Substrate]

The following coating liquid was applied onto one side of a polyethylene terephthalate film, whose both sides had been subjected to a corona discharge treatment, having a thickness of 180 μm, followed by drying the resulting coated layer with heating (at 180° C. for 30 seconds) to thus form an intermediate layer having a coated amount (weighed after being dried) of 0.2 g/m$^2$.

| (Coating Solution for Intermediate Layer) | |
|---|---|
| Polyester latex (Pesresin A-520 available from Takamatsu Oil and Fats Co., Ltd.; solid content: 30% by weight) | 8 g |
| Melamine compound (Sumitex Resin M-3 available from Sumitomo Chemical Co., Ltd.; concentration of effective components: 80% by weight) | 6 g |
| Colloidal silica (Snow Tex C available from Nissan Chemical Co., Ltd.) | 4.8 g |
| Surfactant (polyoxyethylene alkylphenyl ether, Emulgen 911 available from Kao Corporation) | 0.7 g |
| Polystyrene (Nipol UFN1008 having a solid content of 20% by weight and available from Nippon Zeon Co., Ltd.) | 0.04 g |
| Distilled water | 81 g |

Then the following coating liquid was applied onto the side of the polyethylene terephthalate film opposite to the intermediate layer, followed by drying the resulting coated layer with heating (at 180° C. for 30 seconds) to thus form a backing layer having a coated amount (weighed after being dried) of 0.2 g/$m^2$.

| (Coating Liquid for Backing Layer) | |
|---|---|
| Aqueous dispersion of an acrylic resin (Jullimer ET-410 having a solid content of 20% by weight and available from Nippon Pure Chemical Co., Ltd.) | 10 g |
| Aqueous dispersion of tin oxide-antimony oxide (average particle size: 0.1 μm; 17% by weight) | 90 g |
| Melamine compound (Sumitex Resin M-3 available from Sumitomo Chemical Co., Ltd.; concentration of effective components: 80% by weight) | 0.2 g |
| Aqueous solution of sodium alkylsulfonate (Sunded BL available from Sanyo Chemical Industry Co., Ltd.; 44% by weight) | 0.6 g |
| Distilled water | 45 g |

Further the following coating liquid was applied onto the backing layer and then dried with heating (at 170° C. for 30 seconds) to thus form a protective layer in a coated amount (weighed after being dried) of 0.05 g/$m^2$ and to give a substrate.

| (Coating Liquid for Protective Layer) | |
|---|---|
| Polyolefin latex (Chemipearl S-120 having a solid content of 27% by weight available from Mitsui Chemical Co., Ltd.) | 6.2 g |
| Colloidal silica (Snow Tex C available from Nissan Chemical Co., Ltd.) | 1.2 g |
| Aqueous solution of sodium alkylsulfonate (Sunded BL available from Sanyo Chemical Industry Co., Ltd.; 44% by weight) | 0.6 g |
| Epoxy compound (Denacol EX-614B available from Nagase Chemical Co., Ltd.; concentration of the effective component: 100% by weight) | 0.6 g |
| Distilled water | 90 g |

[Formation of Heat-Sensitive Layer]

The following mixed liquid was stirred for 30 minutes in a shaker together with glass beads to thus make carbon black disperse, followed by removal of the glass beads through filtration, addition of 0.005 g of a fluorine atom-containing surfactant (MEGAFAK F177 available from Dainippon Ink and Chemicals, Inc.) and then stirring of the resulting mixture to give a coating liquid for heat-sensitive layer.

This coating liquid was applied onto the foregoing intermediate layer in a coated amount (weighed after being dried) of 1.0 g/$m^2$ and then dried with heating (at 80° C. for 2 minutes) to form a heat-sensitive layer.

| (Coating Liquid 1 for Heat-Sensitive Layer) | |
|---|---|
| Polyurethane resin (a reaction product of 4 moles of 2,4-tolylene diisocyanate/2 moles of 1,3-butylene glycol/1 mole of 2,2'-dimethylol propanoic acid/1 mole of 1,2-tetrapropylene glycol) | 3.0 g |
| Carbon black (MA11 available from Mitsubishi Chemical Co., Ltd.) | 1.5 g |
| Dispersant (Solsparce S24000R available from ICI Company) | 0.2 g |
| Propylene glycol monomethyl ether | 40 g |
| Methyl ethyl ketone | 60 g |

[Formation of Lipophobic Layer]

The following coating liquid was applied onto the foregoing heat-sensitive layer and then dried with heating (at 110° C for one minute) to thus form an addition type silicone rubber layer in a coated amount (weighed after being dried) of 2.0 g/$m^2$ and to give a PS plate.

| (Coating Liquid for Lipophobic Layer) | |
|---|---|
| α,ω-Divinyl polydimethyl siloxane (degree of polymerization: 1500) | 9.0 g |
| $(CH_3)_3SiO(SiH(CH_3)O)_8—Si(CH_3)_3$ | 0.2 g |
| Catalyst CAT-2493 (available from Shin-Etsu Chemical Co., Ltd.) | 0.1 g |
| Crosslinking-inhibitory agent [$HC≡C—C(CH_3)_2—O—Si(CH_3)_3$] | 0.2 g |
| Isopar E (available from Exxon Chemical Company) | 120 g |

The resulting waterless PS plate was imagewise exposed to light using a plate setter PEARLsetter available from Presstek Company (equipped with a semiconductor laser having a wavelength of 830 nm, a beam diameter of 28 μm (1/e2) and the maximum output of 750 mW) to form half-tone dot images of 1751 pi (1270 dpi). Then, within 15 seconds from the completion of the imagewise exposure, the imagewise exposed plate was developed by rubbing the plate surface with a pad for development in the absence of any liquid to thus remove the silicone rubber layer on the laser-exposed area. Thereafter, the plate surface was rubbed with a pad for development containing a processing liquid 1 having the following composition to thus wash off the scum of the silicone rubber layer removed from the laser-exposed area and remaining on the plate surface. As a result, a waterless lithographic printing plate carrying silicone images having sharp edges, on which the images were reproduced at a rate of area carrying half-tone dots ranging from 2 to 98% could be obtained.

| (Processing Liquid 1) | |
|---|---|
| Polyoxyethylene sorbitan monooleate (Leodor TW-0106 available from Kao Corporation) | 5 g |
| Deposit-inhibitory agent BK2 (available from Fuji Photo Film Co., Ltd.) | 2 g |
| Water | 993 g |

Moreover, printed matter was formed using the waterless lithographic printing plate thus prepared and a printing machine (DAIA IF2 available from Mitsubishi Heavy Industries, Ltd.; ink: Aqualess Echo New M Sumi available from Toyo Ink Mfg. Co., Ltd.; applicator roller temperature: 20° C.). As a result, it was found that good printed matters were obtained, which were free of any missing of images due to insufficient development.

EXAMPLE 2

The waterless PS plate prepared in Example 1 was processed into a roll-shaped one, installed on a CTC type four-color printing press: QUICK MASTER DI46-4 Plus (available from Heidelberg Company) and then automatically imagewise exposed to a laser beam and developed (without using any processing liquid) under the standard conditions except that any processing liquid was not used at all during the development. Then the plate surface was washed using a genuine washing liquid for QUICK MASTER and then printing operations were conducted (inks used were Aqualess Echo New M Sumi, Azure, Red and Yellow respectively, available from Toyo Ink Mfg. Co., Ltd.). At this stage, the development was initiated within 15 seconds after the laser-exposure. As a result, it was found that good printed matters were obtained, which were free of any missing of images due to insufficient development.

EXAMPLE 3

The same procedures used in Example 1 were repeated except that the following coating liquid for heat-sensitive layers was substituted for that used in Example 1 to form a waterless PS plate.

| (Coating Liquid 2 for Heat-Sensitive Layer) | |
|---|---|
| Polyurethane resin: KURISBON 3006LV (polyurethane having a solid content of about 30% by weight available from Dainippon Ink & Chemicals, Inc.) | 4.0 g |
| Copolymer of hydroxyethyl methacrylate (20% by weight) with methyl methacrylate (80% by weight) | 0.8 g |
| TITABOND-50 (about 75% solution of titanium diisopropoxide bis(2,4-pentadionate) in isopropanol available from Nippon Soda Co., Ltd.) | 1.4 g |
| Infrared-absorbing dye (KAYASORB IR-820B available from Nippon Kayaku Co., Ltd.) | 1.0 g |
| Fluorine-containing surfactant: MEGAFAK F177 (available from Dainippon Ink & Chemicals, Inc.) | 0.005 g |
| Propylene glycol monomethyl ether | 40 g |
| Methyl ethyl ketone | 60 g |

Then the plate was subjected to an imagewise exposure and development by the method similar to that used in Example 1. As a result, a waterless lithographic printing plate carrying silicone images having sharp edges, on which the images were reproduced at a rate of area carrying half-tone dots ranging from 2 to 98% could be obtained.

Moreover, printing operations were conducted using the resulting waterless lithographic printing plate and the procedures similar to those used in Example 1 and as a result, it was found that good printed matters were obtained, which were free of any missing of images due to insufficient development.

EXAMPLE 4

Imagewise exposure, development and printing operations were conducted according to the same procedures used in Example 2 except that the waterless PS plate prepared in Example 3 was used as the PS plate. As a result, it was found that the results obtained were almost identical to those observed in Example 2.

Comparative Example 1

The same procedures used in Example 1 were repeated except that the printing plate was developed by rubbing the surface thereof with a developing pad containing the processing liquid 1 of Example 1 within 15 seconds after the completion of the imagewise exposure to form a waterless lithographic printing plate. As a result, it was found that the development permitted the reproduction of images only at a rate of area carrying half-tone dots ranging from 4 to 95% and that the edge portions of the silicone images were not sharp, but had shapes with residual fringes. Moreover, printing operations were conducted using the resulting waterless lithographic printing plate and the procedures similar to those used in Example 1 and as a result, it was found that good printed matters were not obtained. More specifically, images were partially skipped off or missed due to insufficient development and the density of the resulting half-tone dots was uneven because of scattering of half-tone dots' shapes.

Comparative Example 2

The waterless PS plate prepared in Example 1 was processed into a roll-shaped one, installed on a CTC type four-color printing press: QUICK MASTER DI46-4 Plus (available from Heidelberg Company) and then automatically imagewise exposed to a laser beam and developed (using a genuine washing liquid for QUICK MASTER as the processing liquid) under the standard conditions. Then printing operations were conducted (inks used were Aqualess Echo New M Sumi, Azure, Red and Yellow respectively, available from Toyo Ink Mfg. Co., Ltd.). At this stage, the development was initiated within 15 seconds after the laser-exposure. As a result, it was found that good printed matters were not obtained. More specifically, images were partially skipped off or missed due to insufficient development and the density of the resulting half-tone dots was uneven because of scattering of half-tone dots' shapes.

EXAMPLES 5 to 8

The same procedures used in Example 2 were repeated except that the development was initiated after 30, 60, 90 and 120 seconds from the completion of the imagewise exposure to conduct imagewise exposure, development and printing operations. As a result, it was found that the results obtained were almost identical to those observed in Example 2.

Comparative Examples 3 to 6

The same procedures used in Comparative Example 2 were repeated except that the development was initiated after 30, 60, 90 and 120 seconds from the completion of the imagewise exposure to conduct imagewise exposure, development and printing operations. As a result, it was found that the longer the development-initiation time after the completion of the imagewise exposure, the lower the missing of images due to insufficient development and the unevenness of the density of the half-tone dots due to scattering of half-tone dots' shapes, but any good printed matter like those obtained in Example 2 could not obtained at all.

EXAMPLE 9

The same procedures used in Example 1 were repeated except that the following hydrophilic layer was substituted for the silicone rubber layer to thus give a wet PS plate.

(Formation of Hydrophilic Layer)

The following coating liquid was applied onto the heat-sensitive layer of Example 1 and then dried with heating (100° C. for 10 minutes) to thus form a hydrophilic layer having a mass (determined after drying) of 2 g/$m^2$.

| (Coating Liquid for Forming Hydrophilic Layer) | |
|---|---|
| Dispersion of 20% titanium oxide/2% polyvinyl alcohol in water (titanium oxide: rutile type one having an average particle size of 200 nm available from WAKO PURE CHEMICAL Co., Ltd./PVA 117 (available from Kuraray Co., Ltd.) = 10/1 (weight ratio) | 20 g |
| Methanol-silica (a colloid consisting of a methanol solution containing 30% by weight of silica particles having a particle size ranging from 10 to 20 nm, available from Nissan Chemical Co., Ltd.) | 5 g |
| Sol-gel formulated liquid (having the following composition) | 4.5 g |
| Polyoxyethylene nonylphenyl ether (NONIPOL 100 available from Sanyo Chemical Industries, Ltd.) | 0.025 g |
| Water | 15 g |
| Methanol | 5 g |

(Preparation of Sol-Gel Formulated Liquid)

The liquid having the following composition was ripened at room temperature for one hour to give a sol-gel formulated liquid.

| | |
|---|---|
| Tetraethoxy silane | 8.5 g |
| Methanol | 1.8 g |
| Water | 15.0 g |
| Phosphoric acid | 0.015 g |

Then imagewise exposure and development were carried out by repeating the same procedures used in Example 1 to thus give a wet lithographic printing plate on which images were reproduced at a rate of area carrying half-tone dots ranging from 2 to 98% and which had images of the hydrophilic layer whose edge portions were quite sharp.

The resulting wet lithographic printing plate was used for printing (printing press: SOR-M available from Heidelberg Company; dampening water: an aqueous solution containing 1% by volume of EU-3 available from Fuji Photo Film Co., Ltd. and 10% by volume of isopropanol; ink: GEOS-G SUMI available from Dainippon Ink and Chemicals, Inc.) and as a result, there were obtained good printed matters free of any missing of image portions due to insufficient development.

EXAMPLE 10

Imagewise exposure, development and printing were carried out by repeating the same procedures used in Example 2 except that the wet PS plate prepared in Example 9 was processed into a roll-shaped one and installed on the printing press and that the printing was carried out according to the one color printing using the emulsion ink having the following composition. As a result, it -was found that good printed matters free of any missing of image portions due to insufficient development were obtained.

(Composition of Emulsion Ink)

[Preparation of Emulsion Ink]

| (1) Preparation of Varnish (In the following, "part" means "part by weight") | |
|---|---|
| Varnish A: | |
| Maleic Acid-Modified Petroleum Resin (Neopolymer 120 available from Nippon Oil Co., Ltd.) | 47 parts |
| Spindle Oil | 53 parts |
| Gel Varnish B: | |
| Rosin-Modified Phenolic Resin (Tamanol 354 available from Arakawa Chemical Industry Co., Ltd.) | 34 parts |
| Machine Oil | 31 parts |
| Spindle Oil | 31 parts |
| Aluminum Stearate | 4 parts |
| Varnish C: | |
| Gilsonite | 25 parts |
| Machine Oil | 75 parts |
| (2) Preparation of Oil-Based Ink: | |
| Carbon black | 14 parts |
| Calcium carbonate (HAKUENKA DD available from Shiraishi Industry Co., Ltd.) | 5 parts |
| Varnish A | 27 parts |
| Gel Varnish B | 7 parts |
| Varnish C | 11 parts |
| Linseed oil | 4 parts |
| Machine oil | 6 parts |
| Spindle oil | 24 parts |
| Cyanine Blue | 1 part |

-continued

| (3) Preparation of hydrophilic Component: | |
|---|---|
| Purified water | 5 parts |
| Ethylene glycol | 25 parts |
| Propylene glycol | 35 parts |
| Glycerin | 34 parts |
| Surfactant (polyoxyethylene alkylphenyl ether, Liponox NCE available from Lion Oils & Fats Co., Ltd.) | One part |

The oil-based ink component (2) (100 parts by weight) and the hydrophilic component (3) (70 parts by weight) were mixed together with stirring to give a W/O type emulsion ink.

EXAMPLE 11

The same procedures used in Example 1 were repeated except for forming a condensed silicone rubber layer using the following coating liquid to form a waterless PS plate. Then the resulting waterless PS plate was processed into a roll-shaped one and imagewise exposure, development and printing were carried out according to the same procedures used in Example 2. As a result, it was found that the results obtained were almost identical to those observed in Example 2.

| (Composition of Coating Liquid for Silicone Rubber Layer) | |
|---|---|
| Dimethyl polysiloxane having hydroxyl groups on both ends (degree of polymerization: 700) | 9.00 g |
| Methyl triacetoxy silane | 0.3 g |
| Dibutyl tin dioctanoate | 0.2 g |
| Isopar G (available from ESSO Chemical Company) | 160 g |

As has been described above in detail, the method of the present invention comprises the steps of imagewise exposing, with a laser beam, an PS plate capable of heat mode recording with a laser beam and then subjected to a developing treatment, which comprises the step of rubbing the plate surface with an abrasion member in the absence of any liquid. This method permits the production of a lithographic printing plate without causing any deterioration of the developing properties of the PS plate even when the imagewise exposed PS plate is developed within a short period of time after the completion of the laser-exposure.

What is claimed is:

1. A method for making a lithographic printing plate, which comprises the steps of imagewise exposing, to a laser beam, a presensitized plate useful for making a lithographic printing plate comprising a substrate, a heat-sensitive layer containing at least one light-heat conversion agent and a binder polymer formed on the substrate and a hydrophilic or lipophobic layer applied onto the heat-sensitive layer; and then removing the hydrophilic or lipophobic layer on the laser-exposed area by developing the imagewise exposed printing plate within 120 seconds from the completion of the laser-exposure to thus give a lithographic printing plate, wherein the developing treatment comprises the step of rubbing the exposed printing plate surface with an abrasion means in the absence of any liquid and wherein the heat-sensitive layer is an ink-receptive layer and a part of the heat-sensitive layer on the laser-exposed area is removed together with the hydrophilic or lipophobic layer.

2. The method according to claim 1, wherein the developing treatment further comprises a step of rubbing the plate surface with an abrasion means in the presence of a liquid after the step of rubbing the plate surface in the absence of any liquid.

3. The method according to claim 1, wherein the binder polymer in the heat-sensitive layer has at least one functional group selected from the group consisting of —OH, —SH, $—NH_2$, —NH—, $—CO—NH_2$, —CO—NH—, —O—CO—NH—, —NH—CO—NH—, —CO—OH, —CO—O—, $—CO—O^-$, —CS—OH, —CO—SH, —CO—O—CO—, $—SO_3H$, $—SO_2(O^-)$, $—PO_3H_2$, $—PO(O^-)_2$, $—SO_2—NH_2$, $—SO_2—NH—$, $—CO—CH_2—CO—$, —CH=CH—, $—CH=CH_2$, $—CO—CH=CH_2$, $—CO—C(CH_3)=CH_2$,

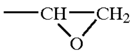 , 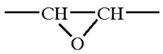 ,

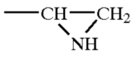 and 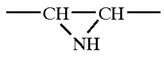 .

4. The method according to claim 1, wherein the heat-sensitive layer further comprises a crosslinking agent.

5. The method according to claim 1, wherein the light-heat conversion agent efficiently absorbs infrared light rays having a wavelength ranging from 700 nm to 1200 nm.

6. The method according to claim 1, wherein the hydrophilic layer is selected from the group consisting of (A) a layer comprising organic hydrophilic matrix, (B) a layer comprising inorganic hydrophilic matrix and (C) thin film of metals or metal compounds having hydrophilic surfaces, wherein the organic hydrophilic matrix is obtained by crosslinking or quasi- crosslinking of organic hydrophilic polymers and the inorganic hydrophilic matrix is obtained by sol-gel transformation consisting of hydrolysis or condensation reactions of polyalkoxy silane, titanates, zirconates or aluminates.

7. The method according to claim 1, wherein the lipophobic layer is a layer of silicone rubber which is selected from the group consisting of (i) condensed type silicone rubber, (ii) addition type silicone rubber and (iii) radiant ray-curable silicone rubber.

8. The method according to claim 1, wherein the hydrophilic layer is selected from the group consisting of (A) a layer comprising organic hydrophilic matrix, (B) a layer comprising inorganic hydrophilic matrix and (C) thin film of metals or metal compounds having hydrophilic surfaces.

* * * * *